(12) United States Patent
Beiner et al.

(10) Patent No.: US 9,658,264 B2
(45) Date of Patent: May 23, 2017

(54) ENERGY METERING SYSTEM WITH SELF-POWERED SENSORS

(71) Applicant: Energybox Ltd., Wanchai (HK)

(72) Inventors: Dirk Beiner, Paderborn (DE); Mihail Mastroyiannis, Clearwater Bay (HK)

(73) Assignee: ENERGYBOX LTD., Wanchai (HK)

(*) Notice: Subject to any disclaimer, the term of this patent is extended or adjusted under 35 U.S.C. 154(b) by 149 days.

(21) Appl. No.: 14/586,710

(22) Filed: Dec. 30, 2014

(65) Prior Publication Data

US 2016/0187396 A1   Jun. 30, 2016

(51) Int. Cl.
| | |
|---|---|
| G01R 33/09 | (2006.01) |
| G01R 15/18 | (2006.01) |
| G01R 21/133 | (2006.01) |
| G01R 33/02 | (2006.01) |
| H02B 1/04 | (2006.01) |

(Continued)

(52) U.S. Cl.
CPC ........... *G01R 21/133* (2013.01); *G01D 4/004* (2013.01); *G01R 33/02* (2013.01); *H02B 1/04* (2013.01); *H02B 1/42* (2013.01); *H02B 1/44* (2013.01); *H02J 5/005* (2013.01); *H02J 13/00* (2013.01); *H02J 17/00* (2013.01); *Y02B 90/242* (2013.01);

(Continued)

(58) Field of Classification Search
CPC .... G01R 19/0092; G01R 33/09; G01R 15/18; G01R 15/207; G01R 33/093; G01R 21/00; G01R 33/07; G01R 15/181; G01R 21/133; G01R 19/2513; H04Q 9/00; H04Q 2209/60; H04Q 2209/40

USPC ..... 324/117 R, 117 H, 126–127, 142, 130 R, 324/251–252; 340/870.01–870.03; 702/60, 62, 64–65

See application file for complete search history.

(56) References Cited

U.S. PATENT DOCUMENTS

| | | | | |
|---|---|---|---|---|
| 4,518,957 A | * | 5/1985 | Wheeler | ............... H01H 71/465 200/5 R |
| 4,611,201 A | * | 9/1986 | Guim | ..................... H01H 71/46 200/310 |

(Continued)

FOREIGN PATENT DOCUMENTS

| | | |
|---|---|---|
| DE | 102007047920 A1 | 12/2008 |
| EP | 0782002 A1 | 7/1997 |

(Continued)

*Primary Examiner* — Patrick Assouad
*Assistant Examiner* — Taqi Nasir
(74) *Attorney, Agent, or Firm* — Slater Matsil, LLP (57) ABSTRACT

The present invention relates to an energy metering system for determining electrical loads of a distribution panel, sensor devices, and fuse boxes for an energy metering system. The energy metering system includes a plurality of sensors for sensing an electrical load of the plurality of circuit breakers and providing corresponding sensor data, wherein the plurality of sensors are arranged in proximity to a plurality of circuit breakers of the distribution panel. The energy metering system also includes a data processing system for converting the sensor data of the plurality of sensors into electrical load information for a plurality of electrical circuits protected by corresponding circuit breakers, and at least one energy harvesting device for powering the plurality of sensors. The at least one energy harvesting device is arranged in front of a protective cover of the distribution panel covering the plurality of electrical circuits.

21 Claims, 3 Drawing Sheets

(51) Int. Cl.
*H02B 1/42* (2006.01)
*H02B 1/44* (2006.01)
*H02J 5/00* (2016.01)
*H02J 17/00* (2006.01)
*G01D 4/00* (2006.01)
*H02J 13/00* (2006.01)

(52) U.S. Cl.
CPC ............ *Y02B 90/248* (2013.01); *Y04S 20/322* (2013.01); *Y04S 20/38* (2013.01); *Y04S 20/52* (2013.01)

(56) References Cited

U.S. PATENT DOCUMENTS

| | | | | |
|---|---|---|---|---|
| 4,706,073 | A * | 11/1987 | Vila Masot | G08B 21/185 337/206 |
| 5,699,276 | A | 12/1997 | Roos | |
| 5,877,691 | A | 3/1999 | Suptitz et al. | |
| 6,330,516 | B1 | 12/2001 | Kammeter | |
| 8,344,724 | B2 * | 1/2013 | Leeb | G01R 33/12 324/228 |
| 8,350,417 | B1 | 1/2013 | Dooley et al. | |
| 8,805,628 | B2 * | 8/2014 | Patel | G01R 15/207 702/62 |
| 8,930,152 | B2 * | 1/2015 | Patel | G01R 15/207 702/104 |
| 9,054,516 | B2 * | 6/2015 | Watford | H02H 3/04 |
| 2003/0050737 | A1 | 3/2003 | Osann, Jr. | |
| 2003/0216877 | A1 | 11/2003 | Culler et al. | |
| 2003/0225482 | A1 | 12/2003 | Topka et al. | |
| 2005/0097373 | A1 | 5/2005 | Stoupis et al. | |
| 2006/0082468 | A1 | 4/2006 | Wang et al. | |
| 2008/0255782 | A1 | 10/2008 | Bilac et al. | |
| 2009/0115426 | A1 | 5/2009 | Muench, Jr. et al. | |
| 2010/0020724 | A1 | 1/2010 | Wimmer et al. | |
| 2010/0076615 | A1 | 3/2010 | Daniel et al. | |
| 2010/0094475 | A1 | 4/2010 | Masters et al. | |
| 2010/0264906 | A1 | 10/2010 | Shamir et al. | |
| 2011/0029149 | A1 | 2/2011 | Wimmer | |
| 2011/0074382 | A1 | 3/2011 | Patel | |
| 2011/0208450 | A1 | 8/2011 | Salka et al. | |
| 2011/0251807 | A1 | 10/2011 | Rada et al. | |
| 2012/0054125 | A1 | 3/2012 | Clifton et al. | |
| 2012/0062249 | A1 | 3/2012 | Shamir | |
| 2012/0068692 | A1 | 3/2012 | Patel et al. | |
| 2012/0271576 | A1 | 10/2012 | Kamel et al. | |
| 2013/0039034 | A1 * | 2/2013 | Baer | H02B 1/306 362/95 |
| 2013/0119972 | A1 * | 5/2013 | Maguire | G01R 35/005 324/74 |
| 2013/0187636 | A1 | 7/2013 | Kast et al. | |
| 2013/0229173 | A1 | 9/2013 | Bertrand | |
| 2013/0254896 | A1 * | 9/2013 | Helmschmidt | G06F 21/64 726/26 |
| 2013/0271111 | A1 | 10/2013 | Makanawala | |
| 2013/0271895 | A1 | 10/2013 | Kuhns | |
| 2013/0320776 | A1 | 12/2013 | Cook | |
| 2014/0170971 | A1 | 6/2014 | Walsh et al. | |
| 2014/0210453 | A1 * | 7/2014 | El-Essawy | G01R 15/142 324/126 |

FOREIGN PATENT DOCUMENTS

| | | |
|---|---|---|
| EP | 1107274 A1 | 6/2001 |
| EP | 2040280 A2 | 3/2009 |
| EP | 2648313 A2 | 10/2013 |
| KR | 20120058953 A | 6/2012 |
| WO | 03073176 A1 | 9/2003 |
| WO | 2009052121 A2 | 4/2009 |
| WO | 2010119332 A1 | 10/2010 |
| WO | 2011103593 A1 | 8/2011 |
| WO | 2012003492 A2 | 1/2012 |
| WO | 2012007831 A2 | 1/2012 |
| WO | 2012099588 A1 | 7/2012 |
| WO | 2012103138 A2 | 8/2012 |

* cited by examiner

ENERGY METERING SYSTEM WITH SELF-POWERED SENSORS

CROSS REFERENCE TO RELATED APPLICATIONS

The present application is related to the following co-pending applications. Co-pending U.S. application Ser. No. 14/586,740, filed Dec. 30, 2014, titled "Energy metering system and method for its calibration" and co-pending U.S. application Ser. No. 14/586,696, filed Dec. 30, 2014, titled "Visualization of electrical loads" disclose further aspects of the inventive energy metering system disclosed herein. Application Ser. No. 14/586,740 provides further details regarding the calibration and operation of the sensor system. Application Ser. No. 14/586,696 provides further details regarding the visualization of sensor data obtained by the metering system. The disclosure of these applications is incorporated herein by reference.

TECHNICAL FIELD

The present invention relates to energy metering systems with a plurality of sensors. In particular embodiments, the present invention relates to an energy metering system with a plurality of self-powered sensors for installation at a distribution panel capable of determining electrical loads on a per circuit basis. Further embodiments of the invention relate to sensor devices and fuse boxes, for example, to a sensor device and a fuse box providing electrical energy for the operation of sensors.

BACKGROUND

In conventional energy distribution networks, the energy consumption of a site is typically measured at a central supply point, e.g., between a supply line of the energy supplier and the first distribution panel of a given site, for example, a single building or a distinct part of a building such as an apartment or the like. In this way, all electrical energy consumed at that particular site can be measured, irrespective of the electrical distribution system of the given site.

Conventional energy metering devices locally record the total use of electrical energy. Such energy metering systems need to be read at regular intervals by the energy consumer, the energy provider or a service company. More recently, so-called smart metering devices have been introduced in several countries. In a smart metering system, a smart metering device communicates the amount of energy consumed at a particular site back to a utility provider, e.g. the energy provider or a service company. In some instances, the amount of energy consumed is reported on request only, e.g. for preparation of a utility bill. Other smart energy metering systems allow a more regular feedback of energy consumption data, for example every day or every hour. In any case, the energy consumed by such energy metering devices is provided by an electrical supply line, to which it is connected.

Reporting an energy consumption back to the utility provider at regular intervals allows the implementation of new charging policies. For example, energy consumers may be rewarded with lower prices by an energy provider if they avoid excessive energy consumption in times of high demand, and instead shift their energy consumption to periods of low demand, such as the night.

While such systems are useful on a macroscopic level, in many cases, energy metering systems measuring the energy consumption of a relatively large site at a single point are insufficient in order to analyze the energy consumption of a single user in detail. For example, a user may detect that he or she uses an above-average amount of energy at a particular time of the day but may be unable to detect where in the house or apartment this energy is consumed.

To overcome this problem, devices have been developed that allow the measurement of the electrical load of a particular device. Such devices can either be installed fixedly at relevant points of an energy distribution network or may be provided as an intermediate device, plugged in between a wall outlet and a device under scrutiny. While these devices are useful in identifying electrical devices causing a particularly high electrical load, such devices are often difficult to install and operate. Moreover, such devices consume at least some of the electrical energy charged to the customer, making it unattractive to install them permanently.

In this context, it is a challenge of the present invention to describe energy metering systems and associated devices that allow an energy consumer or a utility provider to obtain a more detailed assessment of the electric energy consumption at a particular site. Preferably, the energy metering system should consume as little energy itself as possible and be easy to deploy and operate.

SUMMARY

According to one embodiment of the present invention, an energy metering system for determining electrical loads of a distribution panel is provided. The energy metering system comprises a plurality of sensors arranged in proximity to a plurality of circuit breakers of the distribution panel for sensing an electrical load of the plurality of circuit breakers and providing corresponding sensor data. The energy metering system further comprises a data processing system for converting the sensor data of the plurality of sensors into electrical load information for the plurality of electrical circuits protected by corresponding circuit breakers. The energy metering system further comprises at least one energy harvesting device for powering the plurality of sensors, wherein the at least one energy harvesting device is arranged in front of a protective cover of the distribution panel covering the plurality of electrical circuits.

According to another embodiment of the present invention, a sensor device to be arranged on a surface of a housing of at least one circuit breaker is disclosed. The sensor device comprises at least one sensor circuit for sensing an electrical load of at least one electric circuit protected by the at least one circuit breaker and an energy harvesting circuit connected to the at least one sensor circuit and configured to harvest electrical energy emitted from the at least one circuit breaker to power the at least one sensor circuit with the harvested energy.

According to another embodiment, a fuse box accommodating a plurality of circuit breakers is disclosed. Each circuit breaker comprises at least one terminal for connecting a circuit to be protected and at least one operating element. The fuse box comprises a protective cover arranged within the fuse box, the protective cover dividing the inside of the fuse box into an operating area arranged in front of the protective cover, and an installation area arranged behind the protective cover, the protective cover comprising at least one opening for accommodating the plurality of circuit breakers such that the at least one terminal of each circuit breaker is arranged in the installation area and the at least one operating element of each circuit breaker extends through the at least one opening into the operating area. The fuse box further comprises at least one energy harvesting device for harvesting electrical energy emitted by at least one circuit breaker of the plurality of circuit breakers, wherein the energy harvesting device is arranged in the operating area of the fuse box.

The various embodiments of the invention described above enable the implementation of an energy metering system for determining electrical loads of individual circuits of a distribution panel. According to the embodiments, the sensors required for detecting an electrical load of the circuit breakers are powered by one or several energy harvesting devices configured to harvest energy emitted by the circuit breakers.

BRIEF DESCRIPTION OF THE DRAWINGS

Various embodiments of the present invention will be described with reference to the attached drawings. In the drawings, like reference symbols are used for like elements of different embodiments. The accompanying drawings include.

DETAILED DESCRIPTION OF ILLUSTRATIVE EMBODIMENTS

Figure 1:
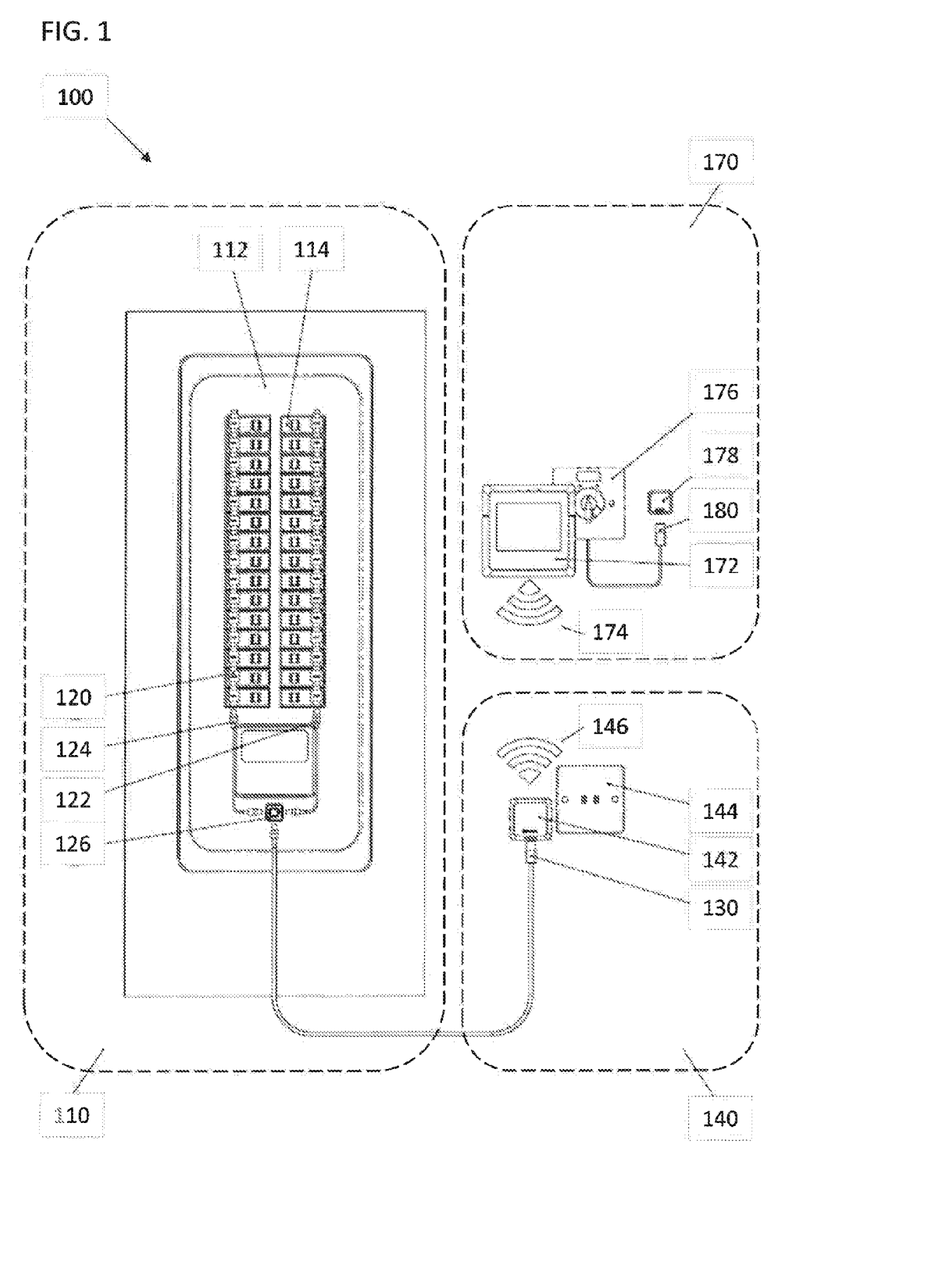
FIG. 1 illustrates a schematic diagram of an energy metering system in accordance with an embodiment of the invention.

FIG. 1 illustrates a schematic diagram of an energy metering system 100 in accordance with an embodiment of the present invention. The energy metering system 100 comprises three sub-systems, a sensor sub-system 110, a data collection sub-system 140 and a data analysis sub-system 170. In other embodiments, several of these sub-systems may be omitted, combined or separated into further sub-systems. For example, the analysis-subsystem 170 may not be present at a customer site, but may be implemented as a cloud-based web-service by a utility provider.

In accordance with the described embodiment, the sensor sub-system 110 is fitted directly onto a conventional electrical distribution panel 112 or into an enclosing fuse box. In the embodiment shown in FIG. 1, the distribution panel 112 comprises two rows of vertically arranged circuit breakers 114. Of course, in other embodiment, the circuit breakers 114 may be arranged horizontally or in a different number of rows and columns. Each circuit breaker 114 is connected inside the distribution panel 112 to a supply line and connected with one of several circuits of a particular site, such as an apartment or a house. For example, a first circuit breaker 114 may be connected to a first circuit supplying the wall sockets of a bedroom with electrical energy. A second circuit breaker 114 may be connected with a second circuit for supplying the wall sockets of a kitchen with electrical energy. A third circuit breaker 114 may be connected directly to a particular powerful electrical appliance, such as an oven, a heater or an air conditioning system.

In order to obtain load information for each individual circuit, in the described embodiment, a sensor 120 is fitted to each one of the circuit breakers 114. Each sensor 120 is configured for sensing the strength of a magnetic field in the area of the respective circuit breaker 114, such as the magnetic field emitted by a protection coil or other internal component of the circuit breaker 114. In particular, a single-chip synchronous three-axis digital magnetometer configured for determining components of a magnetic field or flux in three different spatial directions may be employed. Such sensors are known, for example, from application US 2013/0229173 A1 of Paul Bertrand, the content of which is incorporated herein by reference.

For ease of installation, several of the sensors 120 may be combined to form a sensor device in the form of a sensor strip. Preferably, the individual sensors 120 of a sensor strip may be spaced in accordance with a standardized spacing of circuit breakers 114. In order to accommodate variations in the spacing of the circuit breakers 114, a flexible strip may be used to connect the individual sensors 120. Alternatively, individual sensor devices may be used. The row of sensors may also comprise dummy sensors, i.e. devices having compatible electrical connections and physical dimensions as the sensors 120 described above. Such dummy sensors may be placed between sensors 120 in places where no circuit breaker 114 is present. Moreover, a single housing of a sensor device may comprise two or more sensors 120, in case double or tandem circuit breakers are installed at the distribution panel 112.

In the described embodiment, each sensor device has an associated microcontroller for operating the sensor 120. This may include enforcing an appropriate timing of each measurement with respect to an external clock signal. The microcontroller may also perform data pre-processing, such as digitizing analog measurement results and rejecting obviously incorrect measurements. In case sensor strips or sensor casings with more than one sensor 120 are employed, a single microcontroller may be shared by multiple sensors 120. The power for operation of the microcontroller is provided by an energy harvesting device integrated into the sensor devices as detailed later with respect to FIGS. 2 and 3.

In one embodiment, the sensor devices are attached to the individual circuit breakers 114 by means of an adhesive strip or an adhesive layer on the back of a housing of the sensor devices. Other attachment means, such as elastic clips configured to clip onto a standardized housing of a circuit breaker 114 or a frame that is laid over the circuit breaker 114 including sensor electronics and an area for placing individual marker or label information, may be employed. Such mechanical attachment means ensure a consistent placement of a sensor 120 on top of a circuit breaker 114 at a specific location, corresponding, for example, to an emission hotspot of a magnetic field. The accurate placement of the sensors 120 at a well-defined position improves the comparability of the measurements obtained by different sensors 120. It may also help to optimize an energy harvesting as detailed below.

The individual sensors 120 are connected by an internal bus system not visible in FIG. 1. The bus system may be a parallel bus system having a plurality of parallel bus lines connected to each one of the row of sensors 120. Alternatively, the bus system may also be configured as a daisy chain, i.e. for forwarding data from one sensor 120 to the next. In the described embodiment, the bus system combines both architectures. In particular, a first part of the bus comprising data and clock lines is connected in parallel to all sensors 120. Among others, this allows to synchronize the operation of all sensors 120 of the sensor sub-system 110. A second part of the bus comprises address lines for connecting all sensors 120 of a row of sensors in a daisy chain configuration, allowing to sequentially address each one of the sensors 120 in order.

At one end of each row of sensors 120, connection cables 122 and 124 are connected to the first sensor 120 of that column. In the depicted embodiment, the connection cables 122 and 124 are connected to a junction box 126. As detailed above with respect to the sensors 120, the junction box 126 is preferably fitted to the distribution panel 112 by means of an adhesive tape, an adhesive layer or a magnetic fixture such that it can be fitted without opening the distribution panel 112 and without specialized tools. In another embodiment, the last sensor 120 of a first row of sensors 120 may be connected directly to a first sensor 120 of a further row of sensors 120, such that all sensors 120 form a single chain of sensors 120.

The sensor sub-system 110 may comprise further components not visible in FIG. 1. For example, the sensor sub-system 110 may comprise as a motion detector detecting the presence of a person in proximity to the distribution panel, or a front door sensor detecting an opening state of a covering door of a fuse box enclosing the distribution panel 112. Such additional sensor data may be used by the energy metering system 100 to interrupt the load measurement in case maintenance is performed at the distribution panel 112, which may cause incorrect measuring results. Alternatively, data from such sensors may also be used to trigger a recalibration of the energy metering system 100 as described in co-pending application Ser. No. 14/586,740. In addition, different sets of calibration data may be stored for different operation environments, e.g. with an open or closed fuse box. In this case, data from a door sensor may be used to switch the sets of calibration data accordingly to improve the measuring results. Moreover, the system 100 may generate a notification to a user or administrator to highlight that the door has been opened or left open.

The sensor sub-system 110, comprising the sensors 120, the connection cables 122 and 124 as well as the junction box 126, is connected to the data collection sub-system 140 by means of a feed cable 130. In particular, the feed cable 130 is plugged into the junction box 126 at one end and into a local data aggregation device 142 at the other end.

In the described embodiment, the data aggregation device 142 is integrated into an AC adapter type housing with a plug connector for plugging the data aggregation device 142 into a conventional wall socket 144. Plugging the data aggregation device 142 into the wall socket 144 powers up the data collection sub-system 140. Moreover, plugging the data aggregation device 142 into the wall socket 144 also connects the data aggregation device 142 to a circuit branching off the distribution panel 112. This in turn allows an automatic calibration of the energy metering system to take place as described in co-pending application Ser. No. 14/586,740.

Although not shown in FIG. 1, the data aggregation device may comprise further interfaces for connecting other sensors to the system 100. For example, the data aggregation device 142 may comprise a plug connector or wireless interface for collecting data from other utility or home automation sensors, such as a gas meter, a water meter, or a heat meter. This data may also be recorded together with the electric load information in order to enable a combined power metering and billing for the site.

In the embodiment of FIG. 1, the data collection sub-system 140 is arranged in proximity to the distribution panel 112, e.g. in the same room, but outside of the distribution panel 112 or a surrounding fuse box itself. In contrast, the data analysis sub-system 170 is arranged at a different location. For example, the distribution panel 112, the sensor sub-system 110 and the data collection sub-system 140 may be installed in a basement, a garage or another hard to reach place of a building. In contrast, the data analysis sub-system 170 may be installed in a corridor, an office or a living room inside that building. In other embodiments, the data collection sub-system 140 and/or the data analysis sub-system 170 may be integrated into the distribution panel 112.

In order to establish a data link between the data collection sub-system 140 and the data analysis sub-system 170, the data aggregation device 142 comprises a wireless transmission system 146, such as a Wi-Fi link in accordance to IEEE standard family 802.11. In the embodiment of FIG. 1, the data analysis sub-system 170 comprises a remote terminal 172 with a corresponding wireless transmission system 174. Alternatively, the data aggregation device 142 and the remote terminal 172 may also be connected by means of a direct cable connection or another suitable data transmission system. In particular in case the data aggregation device 142 is integrated into the distribution panel 112, a power line communication may be used to avoid problems with wireless data communication from within a fuse box. Moreover, the data aggregation device 142, the terminal 172 and/or other parts used for data processing may be connected to a data network, such as the Internet, for data exchange.

In the described embodiment, the remote terminal 172 is fitted to a wall using a backplate 176, which also provides the terminal 172 with electrical energy by wireless power transmission. Alternatively, the terminal 172 may comprise a built-in energy supply or may be connected to an external power supply by means of a cable. The electrical energy is supplied from an AC/DC adapter 178 connected to the back plate 176 by means of a supply cable 180. The AC/DC adapter 178 may be plugged into any socket at a location where the terminal 172 is to be installed.

In the described embodiment, the terminal 172 performs most of the data processing of the energy metering system 100. In particular, it receives sensor data provided by the sensors 120 regarding the strength of a magnetic field in the area of the individual circuit breakers 114, as well as a reference current and a reference voltage determined by the data aggregation device 142. The processing of the received data by the terminal 172 is described in more detail in co-pending application Ser. No. 14/586,740. In alternative embodiments, part or all of the processing is performed by other part of the data processing system, e.g. the sensor sub-system 11 or the data-collection sub-system 140. Moreover, some or all of the processing may also be performed by an external entity over a data network, such as a cloud service provided by a utility provider.

In another embodiment, the load information obtained by the terminal 172 is also forwarded to a cloud service arranged in a data network, in particular the Internet (not shown). For this purpose, the terminal may be connected to the data network by means of a network component, for example a modem, a router, or a wireless data network access device. Alternatively, the data aggregation device may forward the load information to the cloud service directly. In this case, the terminal may download the load data from the cloud service rather than from the data aggregation device. The cloud service, which may be provided by the utility provider such as the energy provider or an external service company, comprises a database for storing electrical load information. In the described embodiment, the database comprises current and historical load information of all electricity consumers having a compatible energy metering system 100. In addition, the database 194 may also store further load information, for example load information reported by conventional smart meter devices.

Figure 2:
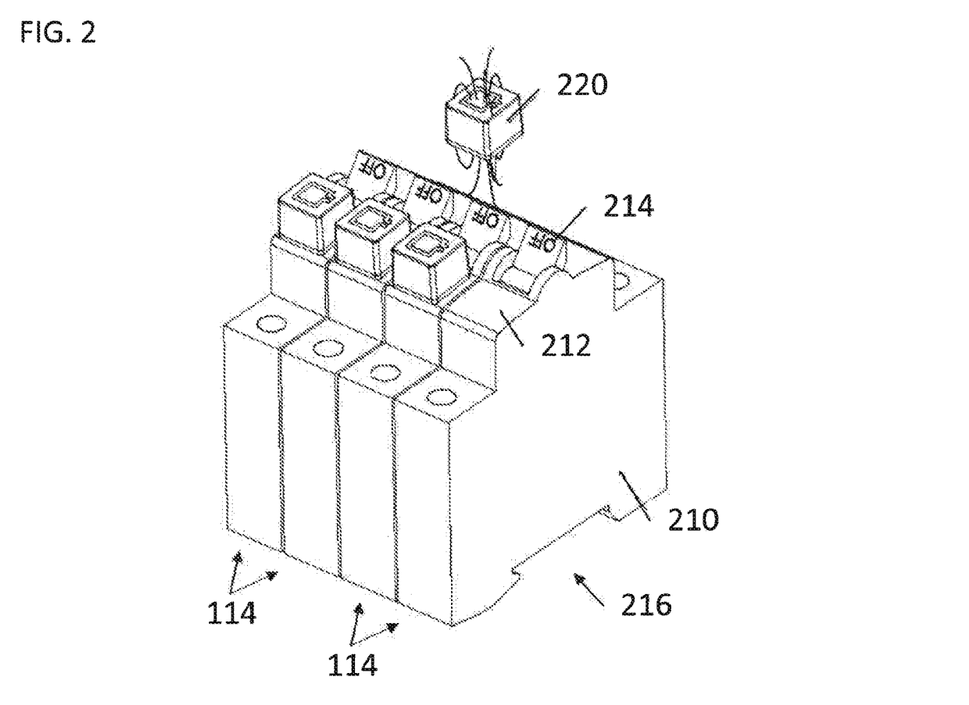
FIG. 2 illustrates a group of circuit breakers with corresponding sensor devices according to an embodiment of the invention.

FIG. 2 illustrates a group of four circuit breakers 114. For example, the group of circuit breakers 114 may be arranged in the distribution panel 112 according to FIG. 1. As can be seen in FIG. 2, each circuit breaker 114 is arranged in a separate housing 210. The housing 210 has a front surface 212. An operating element 214 of the circuit breaker 114, e.g. a switch for disconnecting or connecting a corresponding circuit or resetting the circuit breaker 114, is arranged at the front surface 212. Opposite the front surface 212, an indentation 216 is formed in the housing 210 for placing the circuit breaker 114 on a corresponding distribution rail. Moreover, each circuit breaker 114 comprises another terminal for connecting the circuit breaker 114 to a corresponding electrical circuit. The connection terminals of the circuit breaker 114 are arranged on the rear side of the housing 210 and are therefore not visible in FIG. 2.

In a typical installation, the front surface 212 with the operating element 214 extends through a protective cover of a distribution panel 112. In contrast, the remaining parts of the circuit breaker 114, including the indentation 216 and the terminal for connecting the circuit breaker 113 to an electrical circuit, are arranged behind a protective cover for reasons of electrical safety.

As illustrated in FIG. 2, a sensor device 220 may be placed on the front surface 212 of each one of the circuit breakers 114. Each sensor device 220 has a base surface preferably no larger than the front surface 212 of the circuit breaker 114. In the described embodiment, a side of the sensor device 220 to be placed on the circuit breaker 114 is equipped with an adhesive film for mounting it on the front surface 212.

Figure 3:
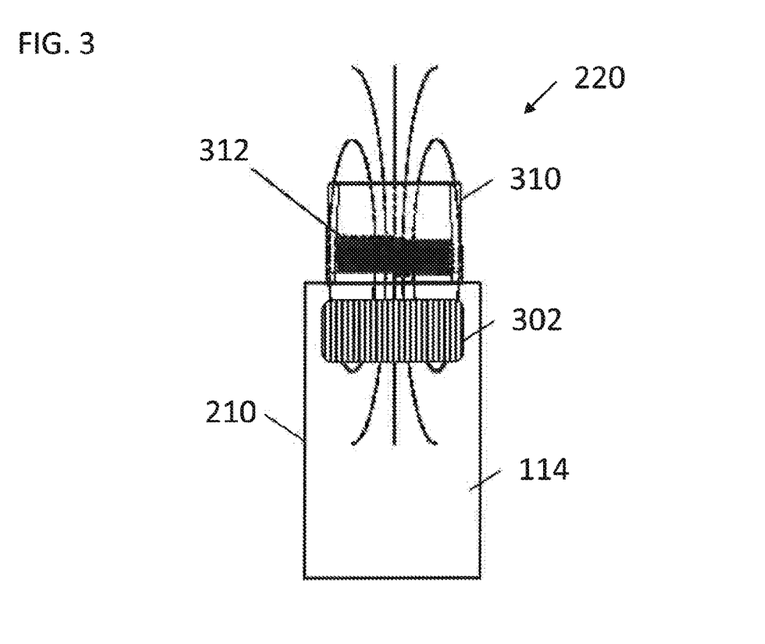
FIG. 3 illustrates a cross section through a circuit breaker fitted with a sensor device in accordance with an embodiment of the invention.

FIG. 3 illustrates a cross-section through a single sensor device 220 fitted onto a circuit breaker 114. As can be seen, a magnetic field emitted by parts of the circuit breaker 114, for example a control coil 302 of the circuit breaker 114, penetrates a housing 310 of the sensor device 220. A magnetic flux coil 312 is arranged in the magnetic field within the housing 310. In the described embodiment, the magnetic flux coil 312 serves a dual purpose. As a first function, the magnetic flux coil 312 converts at least a part of the energy transmitted by the magnetic field of the circuit breaker 114 into electrical energy to operate the sensor device 220. Moreover, the magnetic flux coil 312 may also be used to measure the strength of the magnetic field. Measuring the strength of the magnetic fields allows the energy metering system 100 to determine the electrical load of a circuit connected to the corresponding circuit breaker 114.

In case a common coil 312 is used for sensing and energy harvesting, the sensor device 220 may re-configure the magnetic flux coil 312 either for energy harvesting or for measuring the strength of the magnetic field at different times. In this way, a negative impact of the energy harvesting on the measurement results can be avoided. In the described embodiment, all sensors 120 sense the strength of the magnetic field at the same instant and with a fixed frequency. For example, the frequency and exact timing of the measurements may be determined by a synchronization signal transmitted over the bus system to all sensors 120. At these times, the magnetic flux coil 312 may be connected to a measuring circuit. Conversely, in time intervals where no measurements will take place, the magnetic flux coil 312 may be connected to an energy harvesting circuit. Energy harvested during these periods may be stored in an internal energy store, such as a capacitor, for operation of the sensor device 220 at other times.

In other embodiments, a coil, a capacitor or another energy harvesting component for converting the magnetic energy into electric energy and a separate sensing device may be used. For example, a single-chip synchronous three-axis digital magnetometer as described above with respect to FIG. 1 may be used. In this case the energy harvesting may be performed continuously to maximize the amount of energy harvested. Alternatively, the energy harvesting may also be interrupted during measurements as described above to minimize any disturbance.

In either case, the sensor device 220 may comprise a small microcontroller configured to transmit the obtained measurement results via a data bus to a transmission device such as the local data aggregation device 142. The microcontroller of each sensor device 220 is powered by the coil 312 arranged within the housing 310, such that no external operating energy is required by the sensor device 220.

In the embodiment described with respect to FIGS. 2 and 3, each sensor device 220 comprises the circuitry to implement a single sensor 120. However, in another embodiment, circuitry to implement the functionality of multiple sensors 120 may be integrated within a single sensor device 220 or housing 310. In particular in case of sensor strips as well as double or tandem circuit breakers described above with respect to FIG. 1, only a single coil 312 may be used to collect energy from multiple, neighboring circuit breakers 114. Such a configuration has the advantage that even a sensor 120 placed on a temporarily or permanently disabled circuit breaker 114 may still be supplied with a sufficient operation energy and thus allows a monitoring of the disabled circuit.

Such a monitoring of disabled circuits may also be implemented by the single sensor devices 220 described with respect to FIGS. 2 and 3 by means of power distribution lines integrated into the connection bus. In this case, energy harvested by a first sensor device 220 may be transferred over the bus to a second sensor device 220, incapable of harvesting sufficient energy for its own operation. In this way, energy may be shared between predefined groups of sensors device 220, such as all sensors 120 mounted on a single row of circuit breakers 114.

Figure 4:
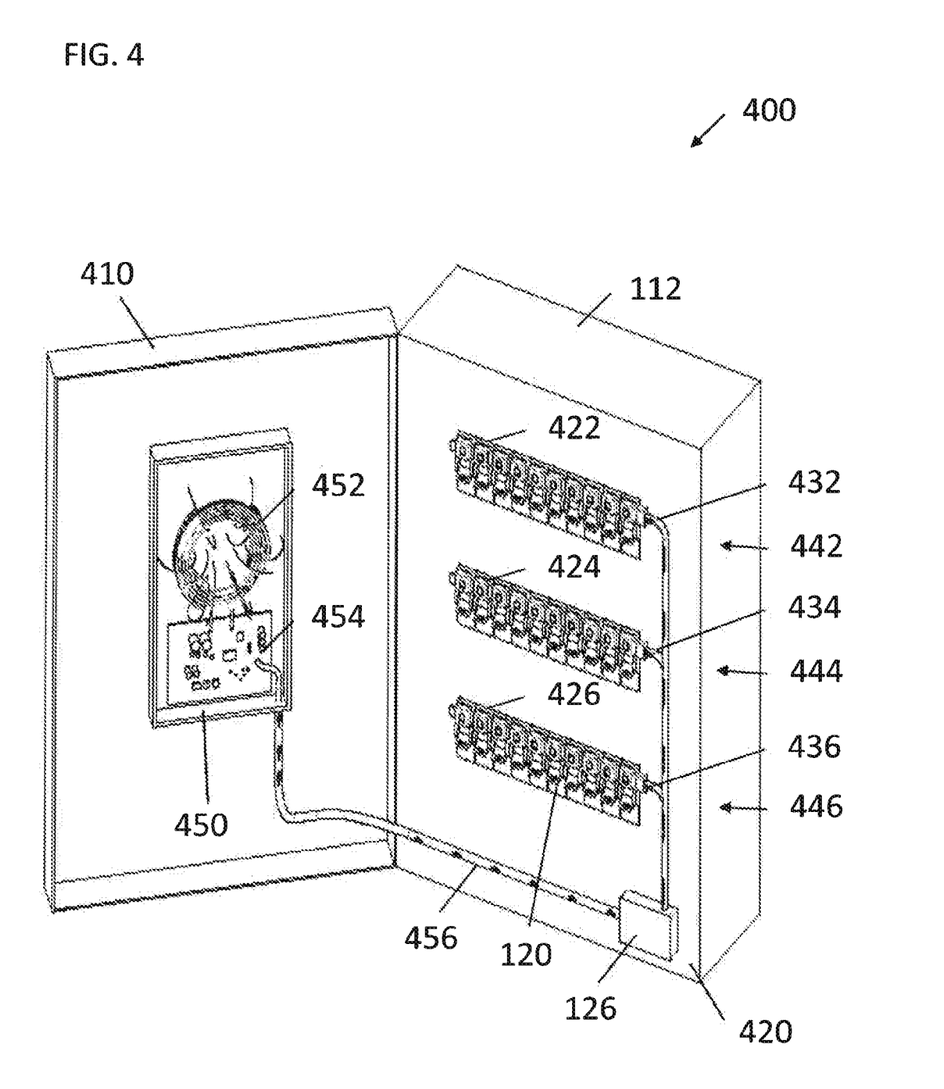
FIG. 4 illustrates a fuse box with an energy metering system in accordance with an embodiment of the invention.

FIG. 4 illustrates a second embodiment of an energy metering system in accordance with the present invention. In particular, FIG. 4 shows a fuse box 400 comprising a distribution panel 112 and a front cover in form of a door 410. The distribution panel 112 comprises a protective cover 420. The protective cover 420 comprises three openings 422, 424 and 426. Each one of the opening 422, 424 and 426 is configured for accommodating a row 442, 444 and 446 of ten circuit breakers 114. For example, each of the three rows 442, 444 and 446 of circuit breakers 114 may be connected to a distribution bar connected to a different phase of an electric three-phase supply network.

As explained above with respect to FIG. 2, a sensor 120 is placed on each of the circuit breakers 114. The sensors 120 of each one of the three rows 442, 444 and 446 are connected by a bus system as detailed above with respect to FIG. 1. Furthermore, the sensors 120 of each row 442, 444 and 446 are connected by a connection cable 432, 434 or 436 to a junction box 126 placed on the protective cover 420.

Contrary to the embodiment explained above with respect to FIGS. 2 and 3, according to the embodiment of FIG. 4, a common energy harvesting module 450 is provided on an inside of the door 410 or other front cover. The energy harvesting module 450 comprises a coil 452 for harvesting electrical energy in the area of the energy distribution panel 112. In the embodiment depicted in FIG. 4, the coil 452 picks up electrical energy emitted primarily from the middle row 444 of circuit breakers 114. However, in another embodiment, the coil 452 essentially covers the entire inside of the door 410 and picks up magnetic energy emitted by all of the circuit breakers 114 of the distribution panel 112.

The energy harvesting module 450 further comprises a circuit board 454. The circuit board 454 comprises a circuit for conditioning and storing energy collected by the coil 452. The energy provided by the energy harvesting circuit of the circuit board 454 is transmitted through a further connection cable 456 back to the connection box 126. The connection box 126 then forwards the electrical energy to the individual sensors 120 by means of the connection cables 432, 434 and 436.

Inversely, the data collected by the sensors 120 is transmitted through the connection cables 432, 434 and 436 to the connection box 126 and onwards through the connection cable 456 to the circuit board 454. In the embodiment described, the circuit board 454 also comprises a transmission circuit for wirelessly transmitting the collected data to a corresponding base station of the energy metering system 100, such as the terminal 172 described above with respect to FIG. 1. Preferably, a transmission antenna of the transmission circuit is arranged on the outside of the door 410. The transmission circuit is also supplied with an operating energy by the energy harvesting circuit.

As detailed with respect to the embodiments of FIGS. 1 to 4, the various components of the described energy metering system 100 are particularly easy to install, even by a consumer. In particular, it is not necessary to open the distribution panel 112, remove its protective cover 420 or disconnect any wires of an energy distribution network in order to perform the installation. This eliminates the risk of an electrical shock and the requirement for a specialized or certified technician.

For example, as detailed above with respect to FIG. 2, the individual sensor devices 220 used for monitoring the circuits branching off the respective circuit breakers 114 may be simply attached to the front of the circuit breakers 114 by means of a double-sided adhesive tape or Velcro fastener.

In other words, the energy metering system 100 represents a so-called plug-and-play solution, which requires no dismantling of the distribution panel 112 and can be installed by practically anybody, including individual consumers. All that is necessary for the installation is the attachment of the sensors 120 to the circuit breakers 114, the relatively simple connection of the sensor devices 220 to the junction box 126 and the data aggregation device 142 or the energy harvesting module 450. In particular in case multiple distribution panels are placed in a single building, e.g. one per level, flat or commercial unit, the ability to place the sensor devices 220 freely, without consideration for their energy supply, further simplified their widespread application.

The energy metering system 100 described above allows the implementation of many novel applications, such as a fine grained analysis of the power consumption of a particular site, sub-unit, user, circuit, or electric device.

For example, energy consumption in different rooms of a building or apartment may be analyzed. Moreover suspicious activity may be detected automatically by noticing a high power consumption at unusual times or at unusual location. One further application is the indirect detection of the presence or absence of people in a particular part of a building, based on the electrical power consumption.

Moreover, based on a comparison of load information of a particular site with those of other sites or average values, a consumer may be provided with suggestions in order to reduce his own energy consumption and therefore help to reduce the generation of greenhouse gases. Similarly, a user may also provide information about an individual budget, for example by means of the terminal 172 or a web service. In this case, the energy metering system 100 may draw the user's attention to a high energy consumption before the preset power budget is exceeded, enabling the consumer to reduce his energy uptake to stay within an agreed budget. In addition, a supplier may predict the power needs of a particular consumer based on historical records of this consumer and potential further information, such as weather or temperature data.

In addition, an energy usage may be monitored over time with a high resolution, e.g. each minute, second or even more often, e.g. with a frequency of 100 Hz or more. By monitoring circuit specific load information over time, unusual events such as faults or wear out of appliances may be detected by noticing a sudden or slow drop or increase of associated electrical loads. With even higher sampling frequencies, such as several kHz, a harmonic analysis of the switch-on characteristic of individual electric devices may be performed, allowing to identify individual devices even when they are connected to the same circuit. Such an analysis may be based on a Fourier transformation of the obtained currents.

While the energy metering system 100 has been described with respect to various, currently preferred embodiments, attention is drawn to the fact that the described system may be altered in several ways without departing from the inventive concepts disclosed herein. In particular, while an energy metering system with sensors for detection of a magnetic field has been described, other sensing technologies, such as the detection of an electrical field or current by a current transformer (CT) may be employed.

THE FOLLOWING LIST OF REFERENCE SIGNS CAN BE USED IN CONJUNCTION WITH THE DRAWINGS 100 energy metering system
110 sensor sub-system
112 distribution panel
114 circuit breaker
120 sensor
122 connection cable
124 connection cable
126 junction box
130 feed cable
140 data collection sub-system
142 data aggregation device
144 wall socket
146 wireless transmission system
170 data collection sub-system
172 remote terminal
174 wireless transmission system
176 backplate
178 AD/DC adapter
180 supply cable
210 housing (of the circuit breaker)
212 front surface 214 operating element
216 indentation
220 sensor device
302 control coil
310 housing (of the sensor device)
312 magnetic flux coil
400 fuse box
410 door
420 protective cover
422, 424, 426 opening
432, 434, 436 connection cables
442, 444, 446 row
450 energy harvesting module
452 coil
454 circuit board
456 connection cable

What is claimed is:

1. An energy metering system for determining electrical loads of a distribution panel, the energy metering system comprising:
a plurality of sensors for sensing an electrical load of a plurality of circuit breakers and providing corresponding sensor data, the plurality of sensors arranged in proximity to the plurality of circuit breakers of the distribution panel;
a data processing system for converting the sensor data of the plurality of sensors into electrical load information for a plurality of electrical circuits protected by corresponding circuit breakers; and
an energy harvesting device for powering the plurality of sensors, wherein the energy harvesting device is arranged in front of a protective cover of the distribution panel covering the plurality of electrical circuits.

2. The energy metering system according to claim 1, wherein a sensor device comprising at least one sensor of the plurality of sensors is attached to a front surface of a corresponding circuit breaker, and wherein the sensor device comprises at least one inductive and/or capacitive element configured for harvesting electrical energy from the respective circuit breaker and/or corresponding electrical circuit.

3. The energy metering system according to claim 2, wherein the at least one inductive and/or capacitive element is further configured as a sensing element of the at least one sensor for detecting a magnetic and/or electric field in the area of the corresponding circuit breaker.

4. The energy metering system according to claim 2, wherein at least two sensors of the plurality of sensors are combined in a first sensor device, and wherein the energy harvested by the inductive and/or capacitive element of the first sensor device is used to power the at least two sensors of the first sensor device.

5. The energy metering system according to claim 2, wherein the energy harvested by all sensor devices is provided by a supply line to supply a data transmission circuit connected with the plurality of sensors with an operating energy.

6. The energy metering system according to claim 1, wherein the energy harvesting device comprises
at least one inductive and/or capacitive element having a core area larger than a front surface area of each one of the circuit breakers, wherein the at least one inductive and/or capacitive element is configured for harvesting electrical energy from a plurality of circuit breakers and/or corresponding electrical circuits.

7. The energy metering system according to claim 6, wherein the at least one inductive and/or capacitive element of the energy harvesting device is arranged at a door of a fuse box housing the distribution panel.

8. The energy metering system according to claim 7, wherein the energy harvesting device comprises a coil having an outer diameter essentially corresponding to a width and/or height of the door of the fuse box housing the distribution panel.

9. The energy metering system according to claim 6, wherein the energy harvesting device is configured to supply all sensors of the energy metering system with an operating energy.

10. The energy metering system according to claim 9, wherein the at least one inductive and/or capacitive element of the at least one energy harvesting device is further configured to supply a data transmission circuit connected with the plurality of sensors with an operating energy.

11. A sensor device to be arranged on a surface of a housing of at least one circuit breaker, the sensor device comprising:
at least one sensor circuit for sensing an electrical load of at least one electrical circuit protected by the at least one circuit breaker; and
an energy harvesting circuit connected to the at least one sensor circuit and configured to harvest electrical energy emitted from the at least one circuit breaker to power the at least one sensor circuit with the harvested energy.

12. The sensor device according to claim 11, wherein the at least one sensor circuit comprises a semiconductor based control circuit, and wherein the at least one energy harvesting circuit comprises at least one inductive and/or capacitive element configured for harvesting electrical energy from the at least one circuit breaker to power the control circuit.

13. The sensor device according to claim 11, comprising at least one magnetic field detection element connected to the sensor circuit and to the energy harvesting circuit, wherein the magnetic field detection element is configured to measure a strength of a magnetic field in the area of the at least one circuit breaker, and to convert a part of a magnetic energy of the magnetic field into electrical energy.

14. The sensor device according to claim 11, comprising at least two sensor circuits, the sensor device being configured to be arranged on a surface of a housing of at least two neighboring circuit breakers, and wherein the energy harvesting circuit is connected to the at least two sensor circuits and configured to harvest electrical energy emitted from the at least two circuit breakers to power the at least two sensor circuits with the harvested energy.

15. The sensor device according to claim 14, wherein the at least two sensor circuits are arranged in separate housings connected by a flexible strip, and wherein the energy harvesting circuit comprises at least one flexible, conductive coil extending at least partly through the separate housings and the flexible strip for harvesting electrical energy from the at least two circuit breakers.

16. The sensor device according to claim 11, further comprising an energy storage device configured for supplying the sensor circuit with an operating energy at intervals when the sensor circuit is sensing an electrical load of at least one electrical circuit, wherein the energy harvesting circuit is further configured to interrupt the harvesting of energy at these intervals when the sensor circuit senses an electrical load of at least one electrical circuit.

17. A fuse box for accommodating a plurality of circuit breakers, each circuit breaker comprising at least one terminal for connecting a circuit to be protected and at least one operating element, the fuse box comprising:

a protective cover arranged within the fuse box, the protective cover dividing the inside of the fuse box into an operating area arranged in front of the protective cover, and an installation area arranged behind the protective cover, the protective cover comprising at least one opening for accommodating the plurality of circuit breakers such that the at least one terminal of each of the circuit breaker is arranged in the installation area and the at least one operating element of each of the circuit breaker extends through the at least one opening into the operating area; and at least one energy harvesting device for harvesting electrical energy emitted by at least one circuit breaker of the plurality of circuit breakers, wherein the energy harvesting device is arranged in the operating area of the fuse box in front of the protective cover covering a plurality of electrical circuits connected to the respective terminals of the plurality of circuit breakers.

18. The fuse box according to claim 17, wherein the energy harvesting device comprises at least one inductive and/or capacitive element having a core area larger than a front surface area of a single circuit breaker of the plurality of circuit breakers, and wherein the at least one inductive and/or capacitive element is arranged for harvesting electrical energy from at least a group of circuit breakers from the plurality of circuit breakers.

19. The fuse box according to claim 18, wherein the fuse box comprises a door for covering the operating area, the at least one inductive and/or capacitive element of the at least one energy harvesting device being arranged on an inside of the door of the fuse box.

20. The fuse box according to claim 19, wherein the at least one coil has an outer diameter essentially corresponding to a width and/or height of the door of the fuse box.

21. The fuse box according to claim 17, further comprising a data transmission circuit arranged at least partly on an outside of the fuse box, wherein the at least energy harvesting device is further configured to provide the data transmission circuit with an operating energy.

* * * * *